(12) United States Patent
Chen et al.

(10) Patent No.: US 10,914,976 B2
(45) Date of Patent: Feb. 9, 2021

(54) ELECTRONIC DEVICE

(71) Applicant: InnoLux Corporation, Miao-Li County (TW)

(72) Inventors: Jian-Cheng Chen, Miao-Li County (TW); Hao-Yu Liou, Miao-Li County (TW); Ayumu Mori, Miao-Li County (TW); Kazuto Jitsui, Miao-Li County (TW); Chung-Kuang Wei, Miao-Li County (TW); Chin-Lung Ting, Miao-Li County (TW); Keiko Edo, Miao-Li County (TW); Minoru Shibazaki, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 68 days.

(21) Appl. No.: 16/177,956

(22) Filed: Nov. 1, 2018

(65) Prior Publication Data

US 2019/0171050 A1  Jun. 6, 2019

Related U.S. Application Data

(60) Provisional application No. 62/593,279, filed on Dec. 1, 2017.

(30) Foreign Application Priority Data

Aug. 13, 2018 (CN) .......................... 2018 1 0914650

(51) Int. Cl.
*G02F 1/1333* (2006.01)
*F21V 8/00* (2006.01)
(Continued)

(52) U.S. Cl.
CPC ....... *G02F 1/13338* (2013.01); *G02B 6/0076* (2013.01); *G06K 9/00006* (2013.01);
(Continued)

(58) Field of Classification Search
CPC .. G06K 9/00; G06K 9/00006; G06K 9/00013; G06K 9/0008; G06K 19/0718; G06K 19/07354; G02F 2001/133638; G02F 1/13363; G02F 1/133528; G06F 2203/04103; G06F 2203/04112; G06F 3/0412; G06F 3/044; G06F 3/0416; G06F 3/041; G06F 1/1637
See application file for complete search history.

(56) References Cited

U.S. PATENT DOCUMENTS 6,347,873 B1 * 2/2002 Hosseini ................ G01D 11/28
362/558
2015/0301249 A1 * 10/2015 Pau ...................... G02B 5/3016
349/124

(Continued)

FOREIGN PATENT DOCUMENTS

CN  106249457 A  12/2016
CN  107025451 A  8/2017

*Primary Examiner* — Dong Hui Liang
(74) *Attorney, Agent, or Firm* — Muncy, Geissler, Olds & Lowe, P.C.

(57) ABSTRACT

Provided is an electronic device including: a sensing component; a polarization film disposed on the sensing component; and a quarter-wave plate disposed between the sensing component and the polarization film.

19 Claims, 13 Drawing Sheets

(51) Int. Cl.
   *G06K 9/00*          (2006.01)
   *G02F 1/1335*      (2006.01)
   *H01L 27/15*       (2006.01)
   *H01L 27/32*       (2006.01)

(52) U.S. Cl.
   CPC .... *G02F 1/133528* (2013.01); *G02F 2201/44* (2013.01); *H01L 27/153* (2013.01); *H01L 27/3234* (2013.01)

(56) References Cited

U.S. PATENT DOCUMENTS

| | | | |
|---|---|---|---|
| 2017/0161543 A1 | 6/2017 | Smith et al. | |
| 2017/0220838 A1* | 8/2017 | He | G06F 3/0418 |
| 2018/0069048 A1* | 3/2018 | Wu | H01L 27/156 |
| 2018/0129798 A1* | 5/2018 | He | G06K 9/0002 |
| 2018/0175125 A1* | 6/2018 | Chung | G06K 9/0004 |
| 2018/0268190 A1* | 9/2018 | Chung | G06K 9/00013 |
| 2018/0357462 A1* | 12/2018 | Mackey | G02F 1/13318 |
| 2019/0050095 A1* | 2/2019 | Schwartz | G06F 3/0416 |

\* cited by examiner

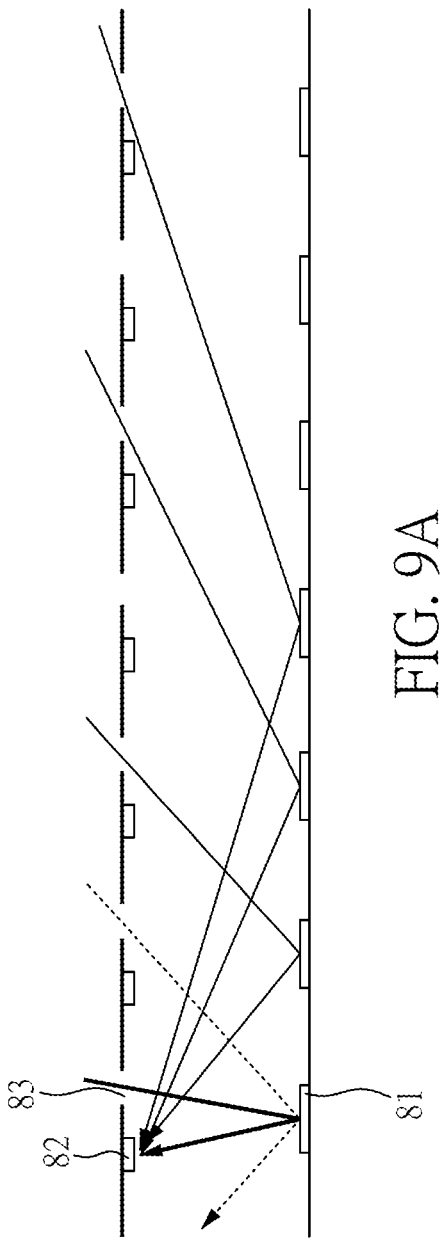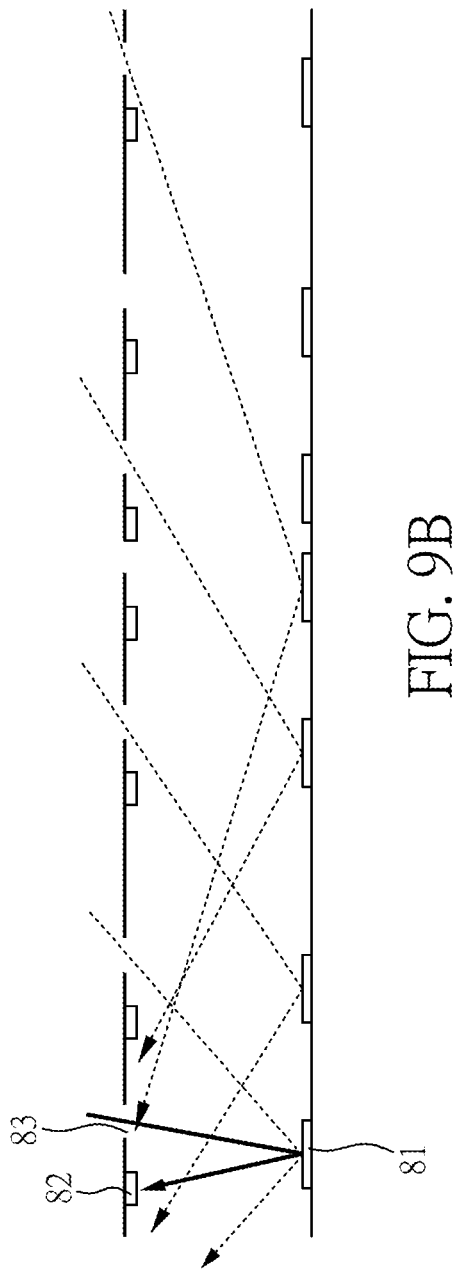

FIG. 9C

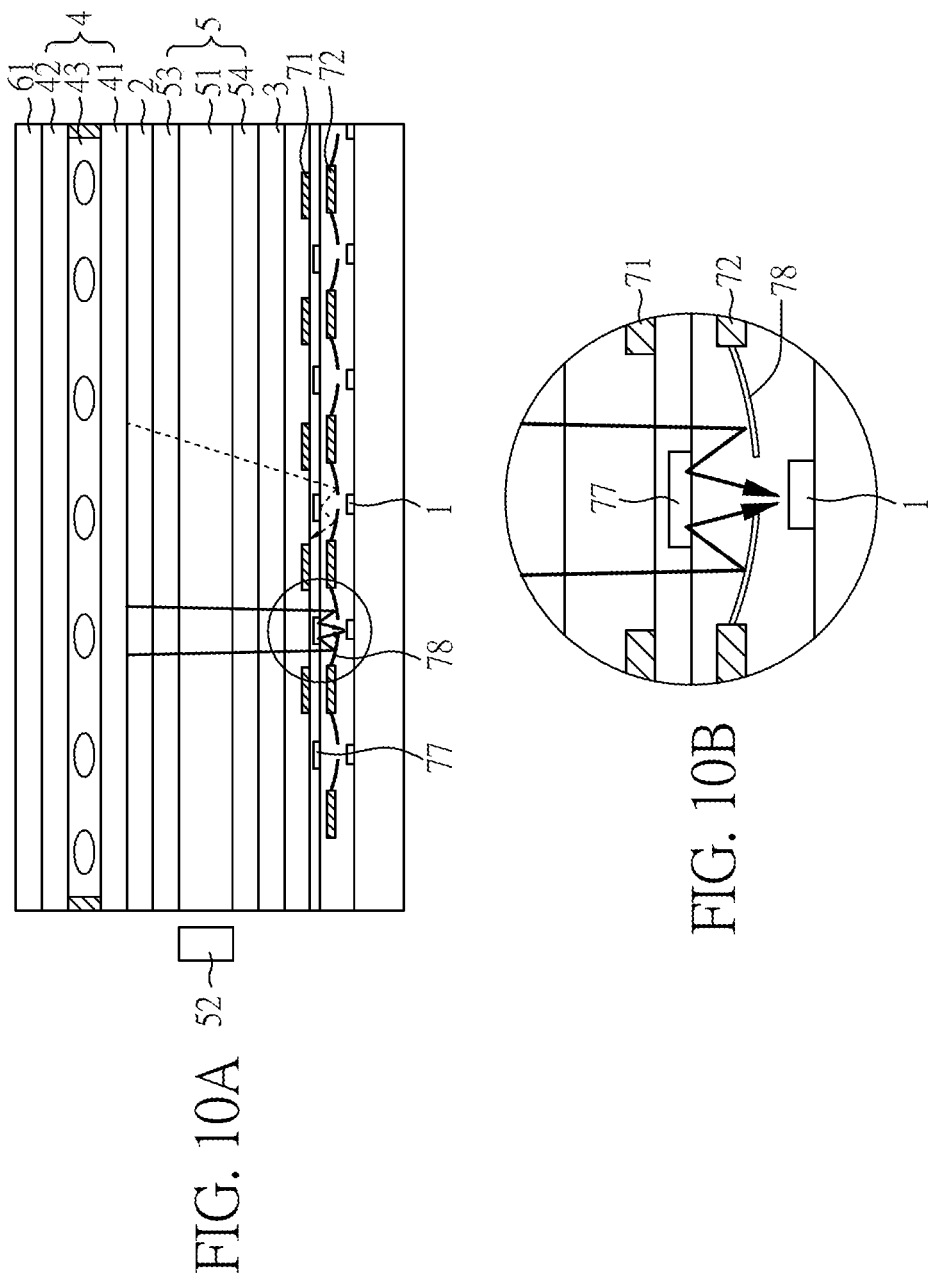

ELECTRONIC DEVICE

CROSS REFERENCE TO RELATED APPLICATION

This application claims the benefits of the Chinese Patent Application Serial Number 201810914650.5, filed on Aug. 13, 2018, the subject matter of which is incorporated herein by reference.

This application also claims the benefit of filing date of U.S. Provisional Application Ser. No. 62/593,279, filed Dec. 1, 2017 under 35 USC § 119(e)(1).

BACKGROUND

1. Field

The present disclosure relates to electronic devices and, more particularly, to an electronic device comprising a display area and a sensing component such that the sensing component is disposed in the display area.

2. Description of Related Art

Owing to technological advancement, electronic products have a trend toward full-screen display in order to meet consumer needs. Therefore, an important topic for research in full-screen display is how to integrate optical sensing components, such as an embedded fingerprint sensor and a front lens, into an electronic device.

However, there are difficulties in placing the embedded sensing component in a display area. For example, when passing through a conventional display system, light is predisposed to interference to the detriment of the accuracy of the embedded sensing component. Furthermore, when placed in the display area, the embedded sensing component is visible to users and thus prevents the display from radiating good taste.

Therefore, it is imperative to provide an electronic device comprising a display area and an embedded sensing component such that the embedded sensing component is disposed in the display area to achieve full-screen display.

SUMMARY

In view of the aforesaid drawbacks of the prior art, it is an objective of the present disclosure to provide an electronic device that achieves full-screen display with a quarter-wave plate and by patterned layering.

In order to achieve the above and other objectives, the present disclosure provides an electronic device. The electronic device comprises: a sensing component; a polarization film disposed on the sensing component; and a quarter-wave plate disposed between the sensing component and the polarization film.

BRIEF DESCRIPTION OF THE DRAWINGS

FIG. 9A and FIG. 9B are schematic views of a portion of the electronic device;

FIG. 9C is a top view of a portion of the electronic device;

FIG. 10A is a cross-sectional view of the electronic device in another embodiment of the present disclosure;

FIG. 10B is a partial enlarged view of FIG. 10A;

DETAILED DESCRIPTION

The implementation of the present disclosure is hereunder illustrated by specific embodiments. Persons skilled in the art can easily understand the other advantages and effects of the present disclosure by referring to the disclosure contained herein. The present disclose can also be implemented or applied by the other different specific embodiments. Depending on different viewpoints and applications, various modifications and changes can be made to the details disclosed herein without departing from the spirit of the present disclosure.

Ordinal numbers, such as 'first', 'second', 'third' and 'fourth", used hereunder describe claimed components but do not state implicitly or explicitly what order the claimed components are previously in, whether a claimed component precedes or follows another claimed component, or what order the steps of a manufacturing method are in. The sole purpose of the ordinal numbers is to distinguish a claimed component from another claimed component when the two claimed components are named exactly the same as each other.

Direction-related prepositions and adjectives used herein, such as "on", "upper" and "above", describe aforesaid two components either in direct contact with each other or not in direct contact with each other.

The present disclosure is hereunder described by illustrative embodiments, but the present disclosure is not limited thereto. The present disclosure may be combined with any other structure to form another embodiment.

Figure 1:
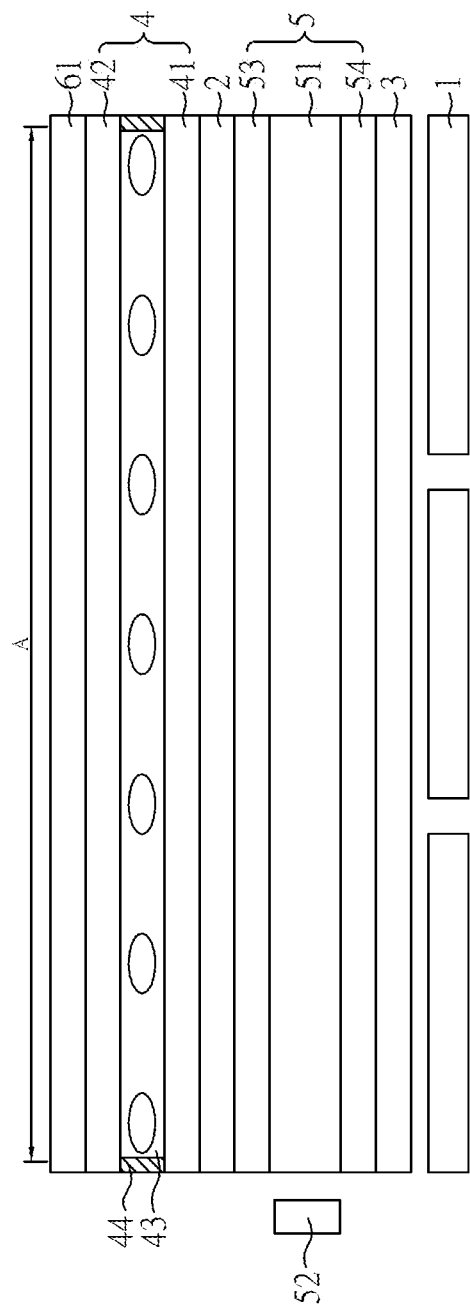
FIG. 1 is a cross-sectional view of an electronic device in an embodiment of the present disclosure.

Referring to FIG. 1, there is shown a cross-sectional view of an electronic device in an embodiment of the present disclosure. As shown in FIG. 1, the electronic device of the present disclosure comprises: a sensing component 1; a polarization film 2 disposed on the sensing component 1; and a quarter-wave plate 3 disposed between the sensing component 1 and the polarization film 2. Since the quarter-wave plate 3 is disposed between the sensing component 1 and the polarization film 2, light which enters the polarization film 2 and reflects off the sensing component 1 can be rotated by the quarter-wave plate 3 by a quarter in terms of its polarized state and thus cannot pass through the polarization film 2 (i.e., is blocked by the polarization film 2). As a result, users of the electronic device cannot see the sensing component 1, and thus the sensing component 1 is visually pleasing or hidden.

When the electronic device is a display device, the electronic device may comprise: a display panel 4 comprising: a first substrate 41; a second substrate 42 disposed on the first substrate 41; and a display medium layer 43 disposed between the first substrate 41 and the second substrate 42; a sensing component 1; a polarization film 2 disposed on the sensing component 1; a quarter-wave plate 3 disposed between the sensing component 1 and the polarization film 2; and a backlight module 5 comprising a light guide component 51, wherein the light guide component 51 is disposed between the sensing component 1 and the polarization film 2; and a first light source 52 disposed adjacent to the light guide component 51. The display panel comprises a display area A such that the sensing component 1, the polarization film 2 and the quarter-wave plate 3 are disposed in the display area A. Since the quarter-wave plate 3 is disposed between the sensing component 1 and the polarization film 2, the sensing component 1 can be disposed in the display area A without being visible, thereby achieving full-screen display.

In an embodiment of the present disclosure, the light guide component 51 is disposed between the polarization film 2 and the quarter-wave plate 3, but the present disclosure is not limited thereto. For instance, the light guide component 51 is disposed between the quarter-wave plate 3 and the sensing component 1.

The first substrate 41 and the second substrate 42 each can be a glass substrate or any other rigid substrate. Alternatively, the first substrate 41 and the second substrate 42 each can be a flexible substrate or a thin-film, wherein the first substrate 41 and the second substrate 42 can be made of the same material or different materials. The electronic device may further comprise a third substrate 61 disposed on the second substrate 42. The third substrate 61 can be a glass substrate or any other rigid substrate. Alternatively, the third substrate 61 can be a flexible substrate or a thin-film. Examples of the glass substrate or any other rigid substrate comprise a quartz substrate, a glass substrate, a silicon wafer substrate, and a sapphire substrate. The material of the flexible substrate or thin-film may comprise, for example, polycarbonate (PC), polyimide (PI), polypropylene (PP), polyethylene terephthalate (PET), any other plastic or polymer, but the present disclosure is not limited thereto.

The display medium layer 43 may comprise liquid crystal (LC), organic light-emitting diode (OLED), quantum dot (QD), quantum dot light-emitting diode (QLED), fluorescent material, phosphor, light-emitting diode (LED), micro light-emitting diode (micro LED) or mini light-emitting diode (mino LED), any other display medium, or a combination thereof, but the present disclosure is not limited thereto. In some embodiments, the LED has a chip scale of around 300 µm to 10 mm, the mini LED has a chip scale of around 100 µm to 300 µm, the micro LED has a chip scale of around 1 µm to 100 µm, but the present disclosure is not limited thereto. The sensing component 1 can be a front lens, a fingerprint sensor or any other optical sensor, but the present disclosure is not limited thereto. The electronic device can be a display device, a fingerprint sensing device, an optical sensing device, or an image capturing device, but the present disclosure is not limited thereto. The light guide component 51 is a transparent light guide component penetrable by light and the material of the light guide component 51 may comprise glass, transparent resin or any other appropriate material, but the present disclosure is not limited thereto. The first light source 52 is can be a light-emitting diode (LED), a cold cathode tube or any other appropriate light source, but the present disclosure is not limited thereto. When the display medium layer 43 comprises liquid crystal, the electronic device further comprises a sealant 44 disposed adjacent to the display medium layer 43. In an embodiment, the sealant 44 surrounds the display medium layer 43.

The backlight module 5 may further comprise a first spacing layer 53 and a second spacing layer 54 which are disposed on an upper surface and a lower surface of the light guide component 51, respectively. Hence, the first spacing layer 53 is disposed between the light guide component 51 and the display panel 4, whereas the second spacing layer 54 is disposed between the light guide component 51 and the sensing component 1, but the present disclosure is not limited thereto. For instance, the light guide component 51 may comprise a first spacing layer 53 disposed on the upper surface of the light guide component 51. Alternatively, the light guide component 51 may comprise a second spacing layer 54 disposed on the lower surface of the light guide component 51. The first spacing layer 53 and the second spacing layer 54 can be an air gap, a silicon oxide layer, an aluminum oxide layer or any other layer with appropriate material, but the present disclosure is not limited thereto.

Figure 2:
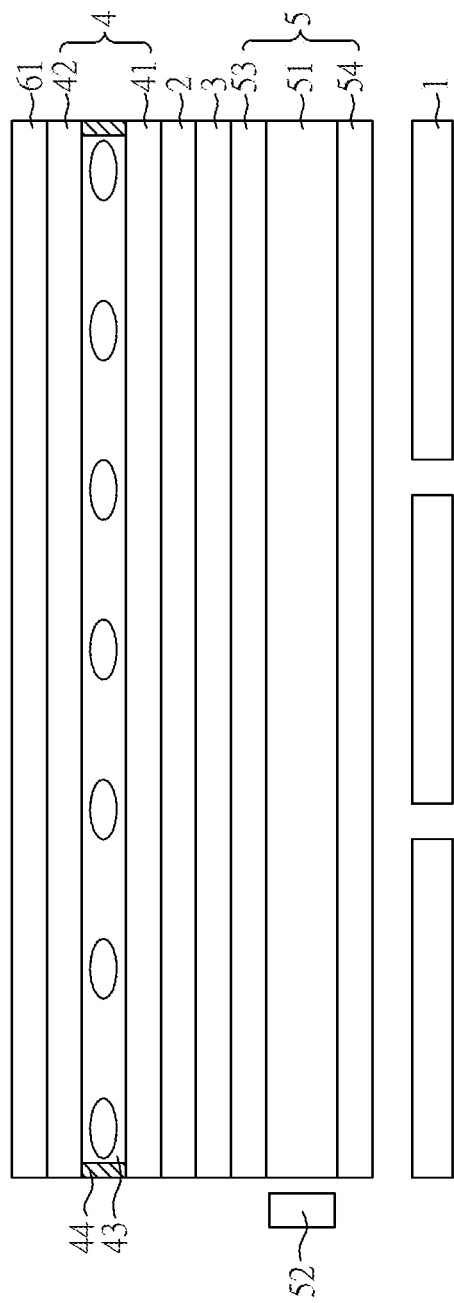
FIG. 2 is a cross-sectional view of the electronic device in another embodiment of the present disclosure.

FIG. 2 is a cross-sectional view of the electronic device in another embodiment of the present disclosure. The electronic device of FIG. 2 is substantially identical to that of FIG. 1 except that the light guide component 51 is disposed between the quarter-wave plate 3 and the sensing component 1. The other technical features of the electronic device of FIG. 2 are the same as their counterparts shown in FIG. 1 and thus are, for the sake of brevity, not described herein again.

Figure 3:
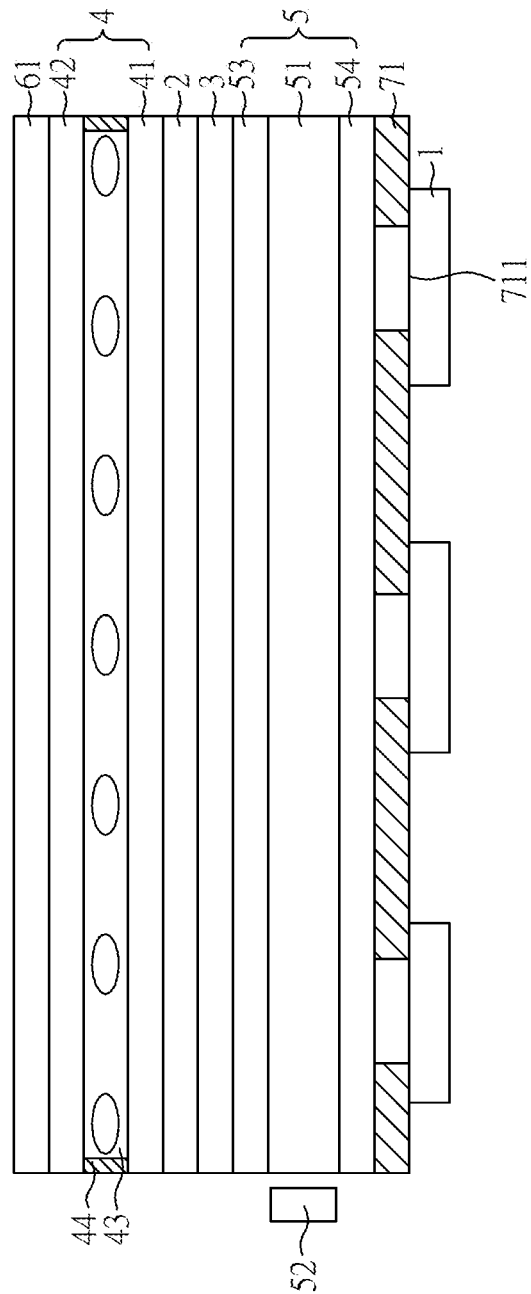
FIG. 3 is a cross-sectional view of the electronic device in an embodiment of the present disclosure.

FIG. 3 is a cross-sectional view of the electronic device in an embodiment of the present disclosure. The electronic device of FIG. 3 is substantially identical to that of FIG. 1 or FIG. 2 except for the differences described below. This embodiment is depicted by FIG. 3, but the present disclosure is not limited thereto. As shown in FIG. 3, the electronic device further comprises a first blocking layer 71. The first blocking layer 71 is disposed between the light guide component 51 and the sensing component 1. The first blocking layer 71 has a plurality of first openings 711.

The first blocking layer 71 can be a first reflecting layer, and the material thereof may comprise aluminum, silver, other suitable metal, an alloy thereof, or a combination thereof. The first blocking layer 71 may comprise a light-blocking material with an absorbance greater than 0.5, such as black matrix or any other appropriate material, but the present disclosure is not limited thereto. The shape and size of the first openings 711 are not limited by the present disclosure; for instance, the first openings 711 can be round, oval, rectangular or of an irregular shape, but the present disclosure is not limited thereto. In this embodiment, the first blocking layer 71 can be a first reflecting layer, and the first openings 711 correspond to the sensing component 1. In an embodiment, one of the first openings 711 corresponds to one of the sensing components 1. In an embodiment, plural first openings 711 correspond to one of the sensing components 1. In an embodiment, one of the first openings 711 corresponds to a plurality of sensing components 1. In an embodiment, one of the first openings 711 does not correspond to the sensing component 1. But the present disclosure is not limited thereto.

Figure 4:
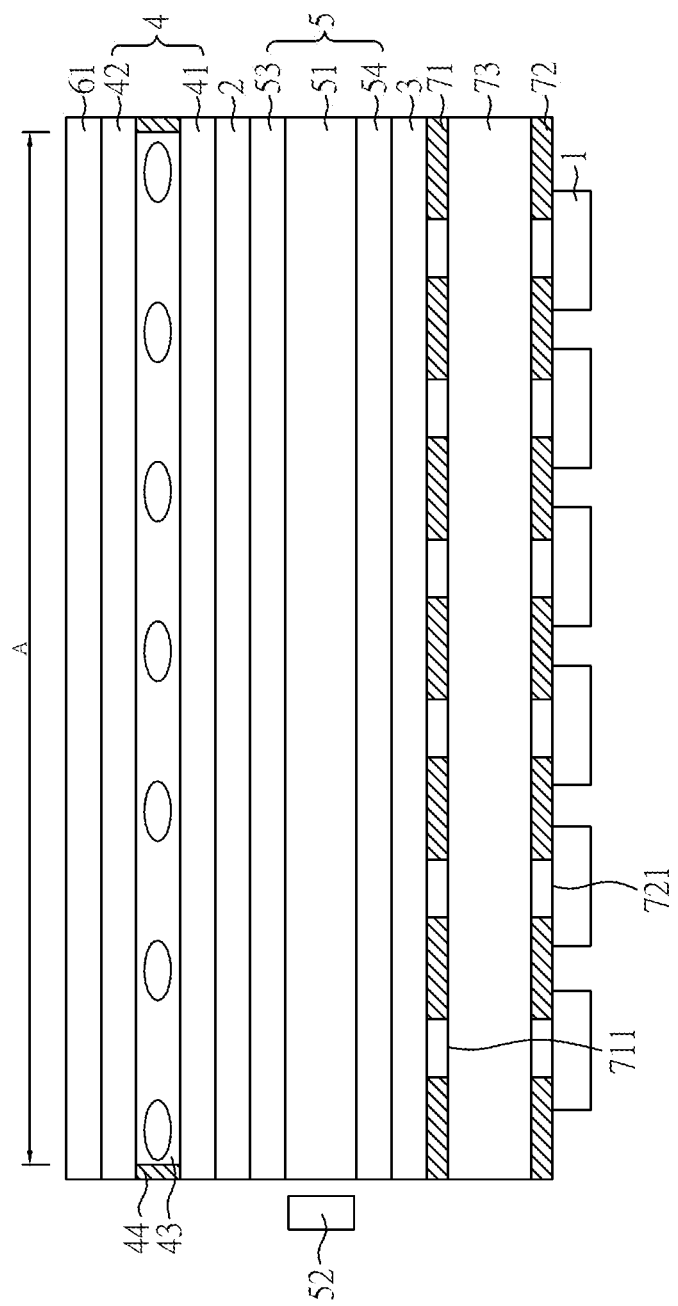
FIG. 4 is a cross-sectional view of the electronic device in an embodiment of the present disclosure.

FIG. 4 is a cross-sectional view of the electronic device in an embodiment of the present disclosure. The electronic device of FIG. 4 is substantially identical to that of FIG. 3 except that the light guide component 51 is disposed between the polarization film 2 and the quarter-wave plate 3, but the present disclosure is not limited thereto. In another embodiment of the present disclosure, the light guide component 51 is disposed between the quarter-wave plate 3 and the sensing component 1. As shown in FIG. 4, the electronic device further comprises: a second blocking layer 72 disposed between the first blocking layer 71 and the sensing component 1, wherein the second blocking layer 72 has a plurality of second openings 721; and a buffer layer 73 disposed between the second blocking layer 72 and the first blocking layer 71, wherein the second blocking layer 72 has an absorbance greater than 0.5 and less than or equal to 1.0, and the buffer layer 73 has an absorbance less than or equal to 0.5 and greater than or equal to zero.

When the sensing component 1 is a fingerprint sensor, the present disclosure entails enhancing the resolution of the fingerprint sensor disposed in the display area A by the first blocking layer 71 and the second blocking layer 72.

The second blocking layer 72 can be a reflecting layer and the material thereof may comprise aluminum, silver, other suitable metal, an alloy thereof, or a combination thereof. The second blocking layer 72 may comprise a light-blocking material with an absorbance greater than 0.5, such as black matrix or any other appropriate material, but the present disclosure is not limited thereto. The material which the buffer layer 73 is made of is not limited by the present disclosure; for instance, the buffer layer 73 may comprise glass or transparent resin, but the present disclosure is not limited thereto. The shape and size of the second openings 721 are not limited by the present disclosure; for instance, the second openings 721 can be round, oval, rectangular or of an irregular shape, but the present disclosure is not limited thereto. In this embodiment, the second blocking layer 72 is a black matrix layer, and the second openings 721 correspond to the sensing component 1. The positions of the second openings 721 relative to the sensing component 1 are similar to the positions of the first openings 711 relative to the sensing component 1 and thus are, for the sake of brevity, not described herein again.

Figure 5:
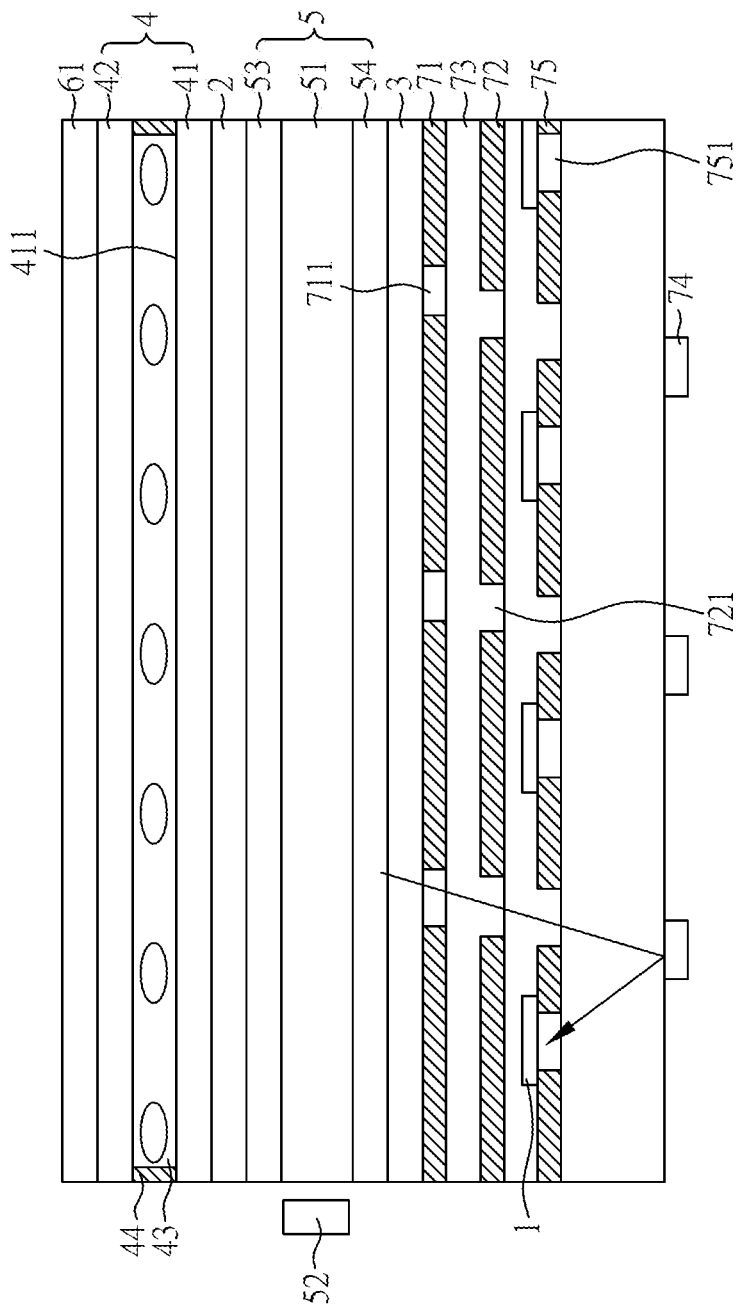
FIG. 5 is a cross-sectional view of the electronic device in an embodiment of the present disclosure.

FIG. 5 is a cross-sectional view of the electronic device in an embodiment of the present disclosure. The electronic device of FIG. 5 is substantially identical to that of FIG. 4 except for the differences described below. As shown in FIG. 5, the electronic device further comprises: a second reflecting layer 74; and a third blocking layer 75 disposed between the second blocking layer 72 and the second reflecting layer 74, wherein the third blocking layer 75 has a plurality of third openings 751, and a distribution density of the second openings 721 can be different from a distribution density of the third openings 751. The sensing component 1 is disposed between the second blocking layer 72 and the second reflecting layer 74. In this embodiment, the electronic device has a reduced thickness because of the second reflecting layer 74. In an embodiment of the present disclosure, the second blocking layer 72 disposed between the first blocking layer 71 and the sensing component 1, and having a plurality of second openings 721; and the third blocking layer 75 disposed between the second blocking layer 72 and the second reflecting layer 74, and having a plurality of third openings 751; wherein in view of a normal direction of an upper surface 411 of the first substrate 41, at least two of the first opening 711, the second opening 721 or the third opening 751 are partially overlapped.

In this embodiment, the third blocking layer 75 can be made of the same material as the second blocking layer 72, whereas the second reflecting layer 74 can be made of the same material as the first reflecting layer 71. The shape and size of the third openings 751 are not limited by the present disclosure; hence, this embodiment will work well, provided that the distribution density of the third openings 751 is different from the distribution density of the second openings 721. In this embodiment, the distribution density of the third openings 751 is greater than the distribution density of the second openings 721, but the present disclosure is not limited thereto. In this embodiment, the second reflecting layer 74 is a patterned reflecting layer, but the present disclosure is not limited thereto.

Figure 6:
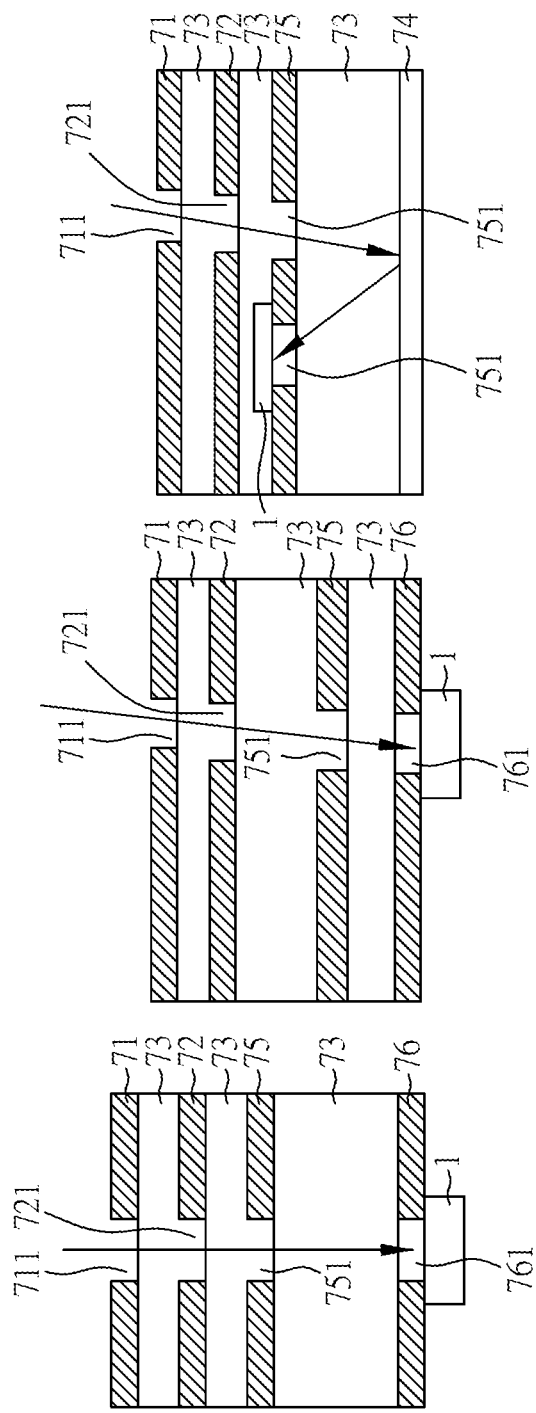
FIG. 6A and FIG. 6B are cross-sectional views of a portion of the electronic device in an embodiment of the present disclosure.
FIG. 6C is a cross-sectional view of a portion of another electronic device in an embodiment of the present disclosure.

FIG. 6A and FIG. 6B are cross-sectional views of a portion of the electronic device in an embodiment of the present disclosure. The electronic device of FIG. 6A and FIG. 6B is substantially identical to that of FIG. 3 or FIG. 4 except that electronic device further comprises: a third blocking layer 75 disposed between the second blocking layer 72 and the sensing component 1 and having a plurality of third openings 751; and a fourth blocking layer 76 disposed between the third blocking layer 75 and the sensing component 1 and having a plurality of fourth openings 761, wherein the fourth openings 761 correspond to the sensing component 1. The positions of the fourth openings 761 relative to the sensing component 1 are similar to the positions of the first openings 711 relative to the sensing component 1 and thus are, for the sake of brevity, not described herein again. The difference between FIG. 6A and FIG. 6B lies in the thickness of the buffer layer 73. As shown in FIG. 6A, the buffer layer 73 disposed between the third blocking layer 75 and the fourth blocking layer 76 has the greatest thickness. As shown in FIG. 6B, the buffer layer 73 disposed between the second blocking layer 72 and the third blocking layer 75 has the greatest thickness, but the present disclosure is not limited thereto. The fourth blocking layer 76 can be made of the same material as the second blocking layer 72. The shapes, sizes and positions of the first openings 711, second openings 721, third openings 751, and fourth openings 761 are not limited by the present disclosure; for instance, the first openings 711, second openings 721, third openings 751, and fourth openings 761 are either aligned with each other as shown in FIG. 6A or are not aligned with each other as shown in FIG. 6B, but the present disclosure is not limited thereto.

FIG. 6C is a cross-sectional view of a portion of another electronic device in an embodiment of the present disclosure. The electronic device of FIG. 6C is substantially identical to that of FIG. 5 except that the second reflecting layer 74 is a full-size reflecting layer. The sensing component 1 is disposed correspondingly to one of the third openings 751, but the present disclosure is not limited thereto. In a variant embodiment, the sensing component 1 is disposed between the second blocking layer 72 and the third blocking layer 75 or between the third blocking layer 75 and the second reflecting layer 74.

Figure 7:
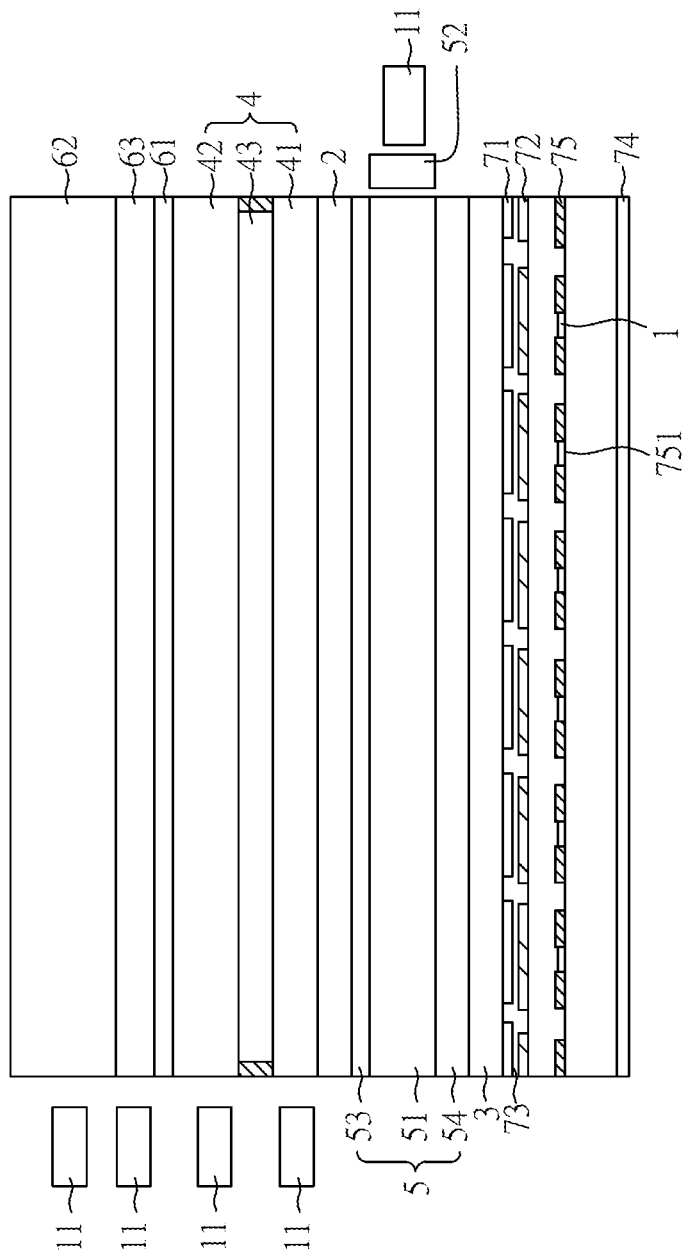
FIG. 7 is a cross-sectional view of the electronic device in an embodiment of the present disclosure.

FIG. 7 is a cross-sectional view of the electronic device in an embodiment of the present disclosure. The electronic device of FIG. 7 is substantially identical to that of FIG. 5 and FIG. 6C except for the differences described below. As shown in FIG. 7, the electronic device further comprises: a fourth substrate 62 disposed on the third substrate 61; a light guide layer 63 disposed between the third substrate 61 and the fourth substrate 62; and a second light source 11 disposed adjacent to at least one of the light guide component 51, the first substrate 41, the second substrate 42, the fourth substrate 62, and the light guide layer 63. The second light source 11 is an invisible light source. To enhance the resolution of the sensing component 1, the electronic device may further comprise the second light source 11 serving as a light source for the sensing component 1. To prevent the second light source 11 from affecting the display effect of the electronic device, the second light source 11 is designed to be an invisible light source, but the present disclosure is not limited thereto. Therefore, this embodiment will work well, provided that the wavelength of the second light source 11 facilitates the detection of the sensing component 1.

In this embodiment, the fourth substrate 62 can be made of the same material as the third substrate 61, whereas the light guide layer 63 can be made of the same material as the light guide component 51. The second light source 11 can be a light-emitting diode (LED), but the present disclosure is not limited thereto.

Figures 8A, 8B:
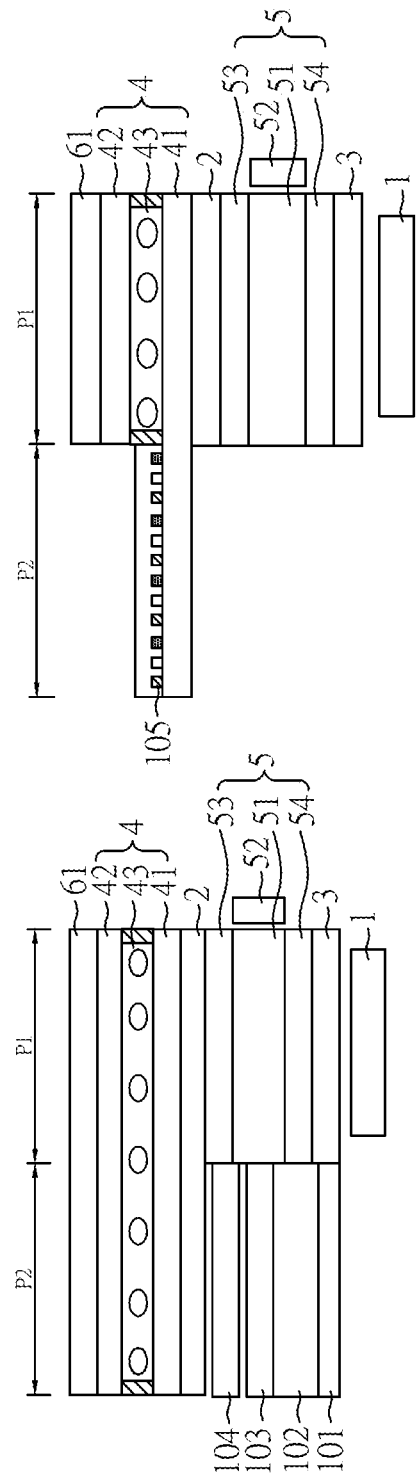
FIG. 8A and FIG. 8B are cross-sectional views of the electronic device in another embodiment of the present disclosure.

FIG. 8A and FIG. 8B are cross-sectional views of the electronic device in another embodiment of the present disclosure. As shown in FIG. 8A and FIG. 8B, the display device of the present disclosure can combine with another display device to form another electronic device, wherein the electronic device comprises a first portion P1 and a second portion P2. The first portion P1 is one of the electronic devices of the present disclosure. The second portion P2 is a conventional liquid crystal display device, light-emitting diode display device, micro light-emitting diode display device, organic light-emitting diode display device, quantum dot light-emitting diode display device or a combination thereof, but the present disclosure is not limited thereto. The electronic device also can combine with a display device with any other display medium. More specifically, the quarter-wave plate 3 corresponds in position to the sensing component 1 to therefore reduce production costs. Regarding the electronic device in an embodiment of the present disclosure, as shown in FIG. 8A, the first portion P1 is one of the electronic devices of the present disclosure, whereas the second portion P2 is a conventional liquid crystal display device. The liquid crystal display device shown in FIG. 8A comprises: a reflecting layer 101; a backlight module 102; a diffusion film 103; a brightening film 104; a polarization film 2; a first substrate 41; a second substrate 42; a display medium layer 43; and a third substrate 61; wherein the display medium layer 43 comprises liquid crystal, but the present disclosure is not limited thereto. Regarding the electronic device in another embodiment of the present disclosure, as shown in FIG. 8B, the first portion P1 is one of the electronic devices of the present disclosure, whereas the second portion P2 is a light-emitting diode display device. The light-emitting diode display device comprises: a first substrate 41; and a fourth light source 105. The fourth light source 105 is an organic light-emitting diode, light-emitting diode, micro light-emitting diode, quantum dot light-emitting diode or a combination thereof, but the present disclosure is not limited thereto.

Figure 9C:
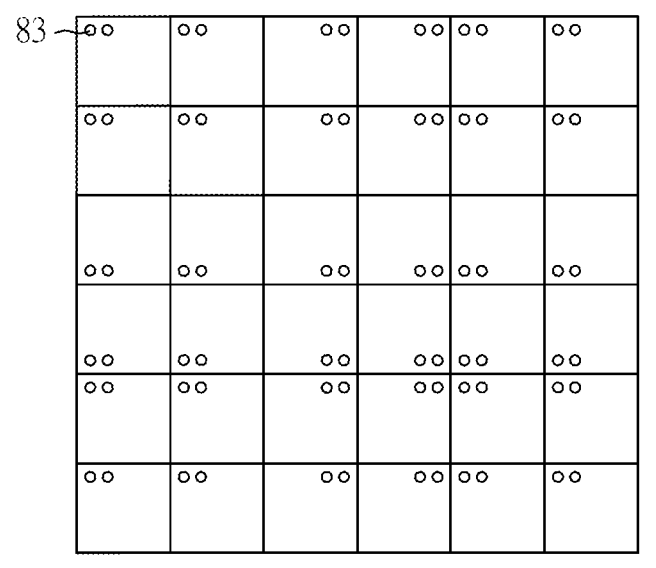

FIG. 9A and FIG. 9B are schematic views of a portion of the electronic device. As shown in FIG. 9A, when the reflecting layer 81, sensing component 82, and openings 83 are spaced apart by equal distances, the sensing component 82 not only receives signals (indicated by bold lines) but also receives any other noise (indicated by fine lines), thereby causing deterioration of sensitivity. Regarding the electronic device in an embodiment of the present disclosure, the spacing distances between the sensing component 82, reflecting layer 81, and openings 83 are adjusted such that the sensing component 82, reflecting layer 81, and openings 83 become spaced apart by unequal distances to therefore reduce the noise received by the sensing component 82, thereby enhancing sensitivity. As shown in FIG. 9B, when the reflecting layer 81, sensing component 82, and openings 83 are spaced apart by unequal distances, there is a reduction in the noise received by the sensing component 82. Noise not received by the sensing component 82 is indicated by dashed lines. When viewed from above, as shown in FIG. 9C, the openings 83 are not spaced apart by equal distances, and thus they are irregularly arranged, thereby reducing the noise to be received by the sensing component 82.

FIG. 10A is a cross-sectional view of the electronic device in another embodiment of the present disclosure. The electronic device of FIG. 10A is substantially identical to that of FIG. 4 except for the differences described below. As shown in FIG. 10, the electronic device further comprises: a third reflecting layer 77 disposed between the first blocking layer 71 and the second blocking layer 72; and a fourth reflecting layer 78 disposed between the third reflecting layer 77 and the sensing component 1, wherein the fourth reflecting layer 78 is curved. Referring to FIG. 10B, there is shown a partial enlarged view of FIG. 10A. The fourth reflecting layer 78 is curved; hence, after a light beam irradiates on the fourth reflecting layer 78, the light beam reflects off the fourth reflecting layer 78 and reaches the third reflecting layer 77. The relative positions of the third reflecting layer 77 and the fourth reflecting layer 78 can be adjusted to further limit the angle of incidence, thereby reducing the noise to be received by the sensing component 1.

The material of the third reflecting layer 77 and the fourth reflecting layer 78 may comprise aluminum, silver, another metal, an alloy thereof, or a combination thereof, but the present disclosure is not limited thereto. In this embodiment, the fourth reflecting layer 78 is a concave mirror.

Figure 11:
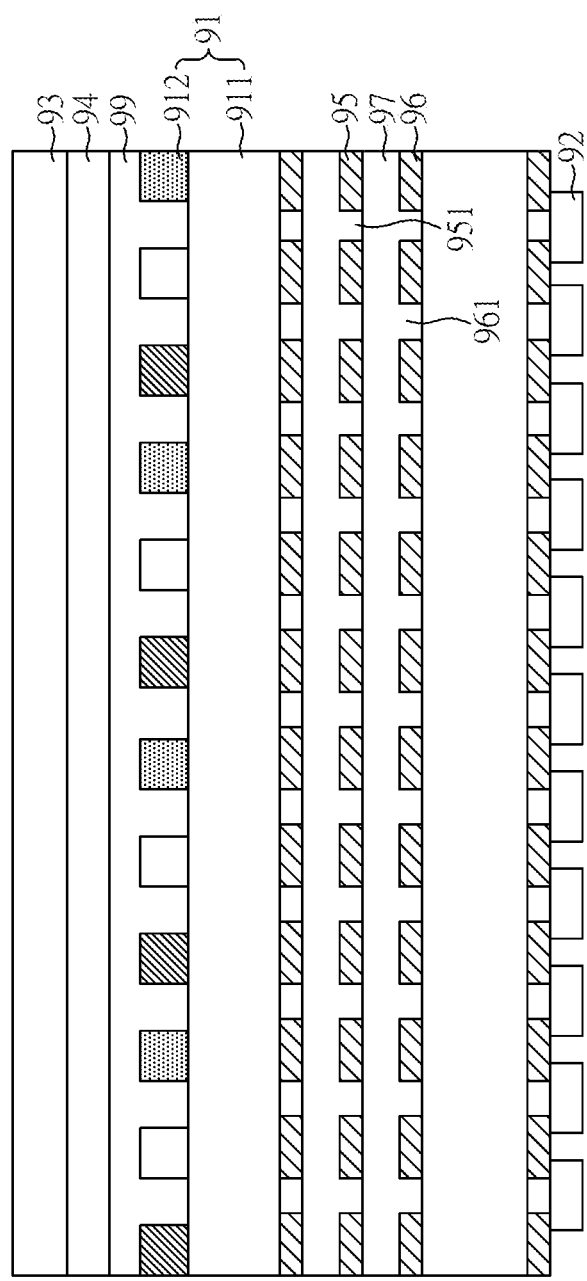
FIG. 11 is a cross-sectional view of the electronic device in another embodiment of the present disclosure.

FIG. 11 is a cross-sectional view of the electronic device in another embodiment of the present disclosure. The electronic device of FIG. 11 is substantially identical to that of FIG. 4 and FIG. 6A except that the electronic device of FIG. 11 dispenses with any light guide component. As shown in FIG. 11, when the electronic device is a display device, the electronic device may comprise: a display panel 91 comprising: a first substrate 911; and a third light source 912 disposed on the first substrate 911; a sensing component 92; a polarization film 93 disposed on the sensing component 92; and a quarter-wave plate 94 disposed between the sensing component 92 and the polarization film 93. The polarization film 93 and the quarter-wave plate 94 are disposed on the display panel 91. The quarter-wave plate 94 is disposed between the polarization film 93 and the display panel 91. In an embodiment, the electronic device comprises a protective layer 99 disposed on the third light source 912. For instance, the protective layer 99 is disposed between the third light source 912 and the quarter-wave plate 94.

In an embodiment of the present disclosure, the electronic device may further comprise a second blocking layer 95 disposed between the quarter-wave plate 94 and the sensing component 92. The second blocking layer 95 is disposed between the display panel 91 and the sensing component 92. The second blocking layer 95 has a plurality of second openings 951 and has an absorbance greater than 0.5. In an embodiment of the present disclosure, the electronic device may further comprise: a third blocking layer 96 having a plurality of third openings 961 and having an absorbance greater than 0.5; and a buffer layer 97 disposed between the second blocking layer 95 and the third blocking layer 96 and having an absorbance less than 0.5.

In this embodiment, the second openings 951 correspond in position to the sensing component 92, but the present disclosure is not limited thereto. The positions of the second openings 951 relative to the sensing component 92 are similar to the positions of the first openings 711 relative to the sensing component 1 and thus are, for the sake of brevity, not described herein again. In an embodiment, the third light source 912 is a light-emitting diode, a micro light-emitting diode, an organic light-emitting diode, or a quantum dot light-emitting diode, but the present disclosure is not limited thereto. The protective layer 99 can be an insulating layer, a planer layer, an encapsulating layer (inorganic layer-organic layer-inorganic layer), a blocking structure, a light-blocking structure, an encapsulating structure, or a light-form adjustment structure, but the present disclosure is not limited thereto.

Figure 12:
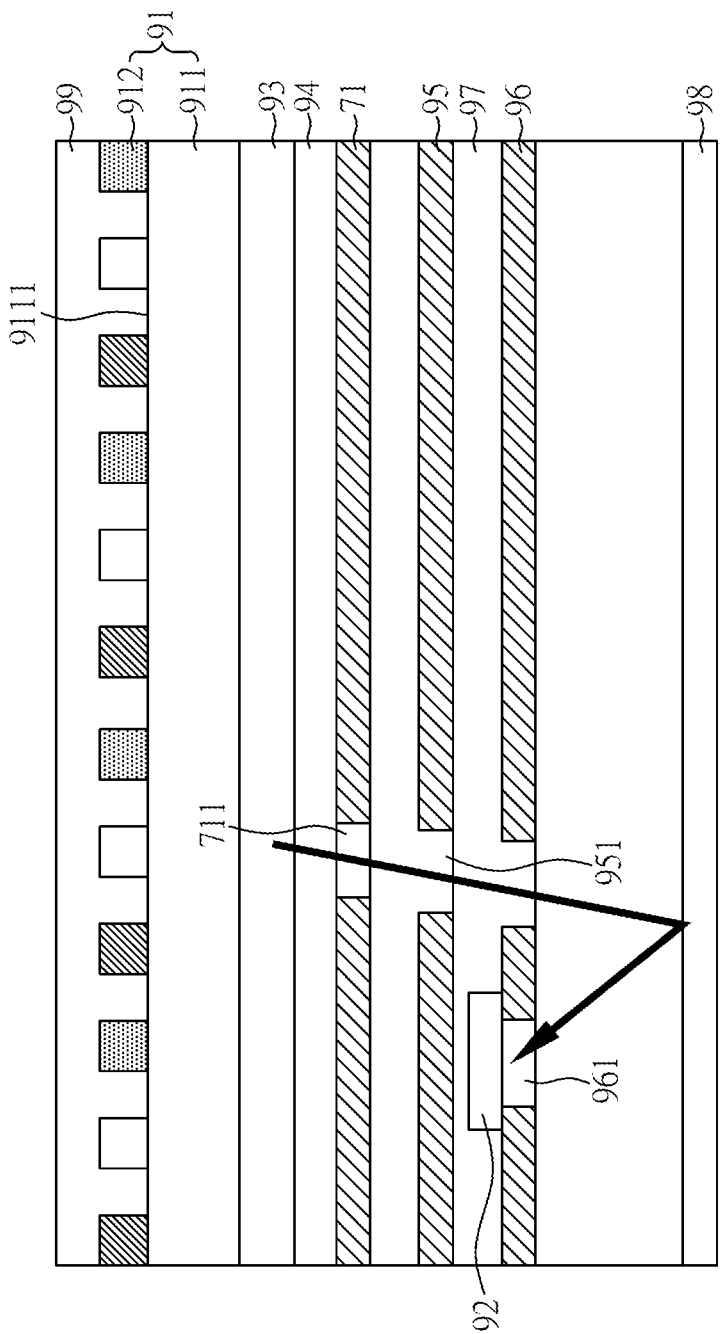
FIG. 12 is a cross-sectional view of the electronic device in another embodiment of the present disclosure.

FIG. 12 is a cross-sectional view of the electronic device in another embodiment of the present disclosure. The electronic device of FIG. 12 is substantially identical to that of FIG. 11 except that the polarization film 93 and the quarter-wave plate 94 are disposed between the display panel 91 and the sensing component 92, whereas the polarization film 93 is disposed between the display panel 91 and the quarter-wave plate 94. The electronic device may further comprise a second reflecting layer 98. The third blocking layer 96 is disposed between the second blocking layer 95 and the second reflecting layer 98, whereas the second blocking layer 95 is disposed between the quarter-wave plate 94 and the third blocking layer 96, wherein the distribution density of the second openings 951 is different from the distribution density of the third openings 961. In an embodiment of the present disclosure, the sensing component 92 is disposed between the second blocking layer 95 and the second reflecting layer 98. In an embodiment of the present disclosure, the sensing component 92 is disposed between the second blocking layer 95 and the third blocking layer 96. In an embodiment of the present disclosure, the second blocking layer 95 disposed between the first blocking layer 71 and the sensing component 92, and having a plurality of second openings 951; and the third blocking layer 96 disposed between the second blocking layer 95 and the second reflecting layer 98, and having a plurality of third openings 961; wherein in view of a normal direction of an upper surface 9111 of the first substrate 911, at least two of the first opening 711, the second opening 951 or the third opening 961 are partially overlapped.

In conclusion, an electronic device of the present disclosure is characterized in that a quarter-wave plate is disposed between a sensing component and a polarization film such that the sensing component can be disposed in a display area and thus is unlikely to be seen, so as to achieve full-screen display.

The aforesaid specific embodiments of the present disclosure must be interpreted to be solely illustrative rather than restrictive, in any way, of the present disclosure.

What is claimed is:

1. An electronic device, comprising:
a sensing component;
a polarization film disposed on the sensing component;
a quarter-wave plate disposed between the sensing component and the polarization film;
a first blocking layer disposed on the sensing component, the first blocking layer having a plurality of first openings;
a second blocking layer disposed between the first blocking layer and the sensing component; and
a buffer layer disposed between the second blocking layer and the first blocking layer,
wherein the second blocking layer has an absorbance greater than 0.5 and less than or equal to 1.0, and the buffer layer has an absorbance less than or equal to 0.5 and greater than or equal to zero.

2. The electronic device of claim 1, wherein the second blocking layer is disposed between the quarter-wave plate and the sensing component, wherein the second blocking layer has a plurality of second openings.

3. The electronic device of claim 2, further comprising: a third blocking layer having a plurality of third openings; and another buffer layer disposed between the second blocking layer and the third blocking layer and having an absorbance less than or equal to 0.5 and greater than or equal to zero.

4. The electronic device of claim 3, further comprising a second reflecting layer, wherein the third blocking layer is disposed between the second blocking layer and the second reflecting layer, and a distribution density of the plurality of second openings is different from a distribution density of the plurality of third openings in density of distribution.

5. The electronic device of claim 4, wherein the sensing component is disposed between the second blocking layer and the second reflecting layer.

6. The electronic device of claim 2, wherein the plurality of second openings correspond to the sensing component.

7. The electronic device of claim 1, further comprising a light guide component disposed between the sensing component and the polarization film.

8. The electronic device of claim 7, wherein the first blocking layer is disposed between the light guide component and the sensing component.

9. The electronic device of claim 8, further comprising:
a second reflecting layer; and
a third blocking layer disposed between the second blocking layer and the second reflecting layer, and having a plurality of third openings;
wherein the second blocking layer has a plurality of second openings; and
wherein in view of a normal direction of an upper surface of the first substrate, at least two of the first opening, the second opening or the third opening are partially overlapped.

10. The electronic device of claim 7, further comprising a first spacing layer disposed on an upper surface of the light guide component.

11. The electronic device of claim 10, wherein the first spacing layer is an air gap, a silicon oxide layer, or an aluminum oxide layer.

12. The electronic device of claim 7, wherein the light guide component is disposed between the polarization film and the quarter-wave plate.

13. The electronic device of claim 7, wherein the light guide component is disposed between the quarter-wave plate and the sensing component.

14. The electronic device of claim 7, further comprising a second spacing layer disposed on a lower surface of the light guide component.

15. The electronic device of claim 1, further comprising: a second reflecting layer; and a third blocking layer disposed between the second blocking layer and the second reflecting layer, wherein the second blocking layer has a plurality of second openings, the third blocking layer has a plurality of third openings, and a distribution density of the plurality of second openings is different from a distribution density of the plurality of third openings.

16. The electronic device of claim 15, wherein the sensing component is disposed between the second blocking layer and the second reflecting layer.

17. The electronic device of claim 1, wherein the first blocking layer is a first reflecting layer, and the first openings correspond to the sensing component.

18. The electronic device of claim 1, wherein the electronic device is a display device comprising a display area, and the sensing component, the polarization film and the quarter-wave plate are disposed in the display area.

19. The electronic device of claim 1, wherein the sensing component is a front lens or a fingerprint sensor.

* * * * *